United States Patent [19]

Okamura

[11] Patent Number: 5,528,130
[45] Date of Patent: Jun. 18, 1996

[54] INTERMEDIATE POTENTIAL GENERATING CIRCUIT HAVING OUTPUT STABILIZING CIRCUIT

[75] Inventor: Jun-ichi Okamura, Yokohama, Japan

[73] Assignee: Kabushiki Kaisha Toshiba, Kawasaki, Japan

[21] Appl. No.: 300,513

[22] Filed: Sep. 6, 1994

Related U.S. Application Data

[63] Continuation of Ser. No. 64,377, May 21, 1993, abandoned.

[30] Foreign Application Priority Data

May 22, 1992 [JP] Japan .................................. 4-130980

[51] Int. Cl.$^6$ ....................................... G05F 3/24
[52] U.S. Cl. ............................. 323/314; 327/539
[58] Field of Search ................................. 323/312, 313, 323/314, 315, 316; 307/296.7, 296.6

[56] References Cited

U.S. PATENT DOCUMENTS

| | | | |
|---|---|---|---|
| 4,663,584 | 5/1987 | Okada et al. | 323/313 |
| 4,812,735 | 3/1989 | Sawada et al. | 323/313 |
| 4,906,914 | 3/1990 | Ohsawa | 323/314 |

*Primary Examiner*—Peter S. Wong
*Assistant Examiner*—Shawn Riley
*Attorney, Agent, or Firm*—Banner & Allegretti, Ltd.

[57] ABSTRACT

The present invention is characterized in that if a potential at an output node is increased to a higher predetermined level than an output potential a MOS transistor of a potential stabilizing circuit, which is disposed at a ground power supply side, is turned on thereby turning on a MOS transistor disposed at the ground power supply side, forcing the potential at the output node to be restored to the same level as that of the output potential, and if the potential at the output node is decreased to a lower predetermined level than the output potential a MOS transistor of the potential stabilizing circuit, which is disposed at a power supply side, is turned on thereby turning on a MOS transistor disposed at the power supply side, forcing the potential at the output node to be restored to the same level as that of the output potential.

17 Claims, 4 Drawing Sheets

INTERMEDIATE POTENTIAL GENERATING CIRCUIT HAVING OUTPUT STABILIZING CIRCUIT

This application is a continuation of application Ser. No. 08/064,377, filed May 21, 1993 now abandoned.

BACKGROUND OF THE INVENTION

1. Field of the Invention

The present invention relates to an intermediate potential generating circuit having an output stabilizing circuit for generating an intermediate potential.

2. Description of the Related Art

In a semiconductor integrated circuit, a potential having an intermediate value between a power source voltage and a ground voltage must be frequently generated. As an intermediate potential generating circuit for generating the intermediate potential, for example, a conventional circuit described in U.S. Pat. No. 4,663,584 is well known.

Figure 1:
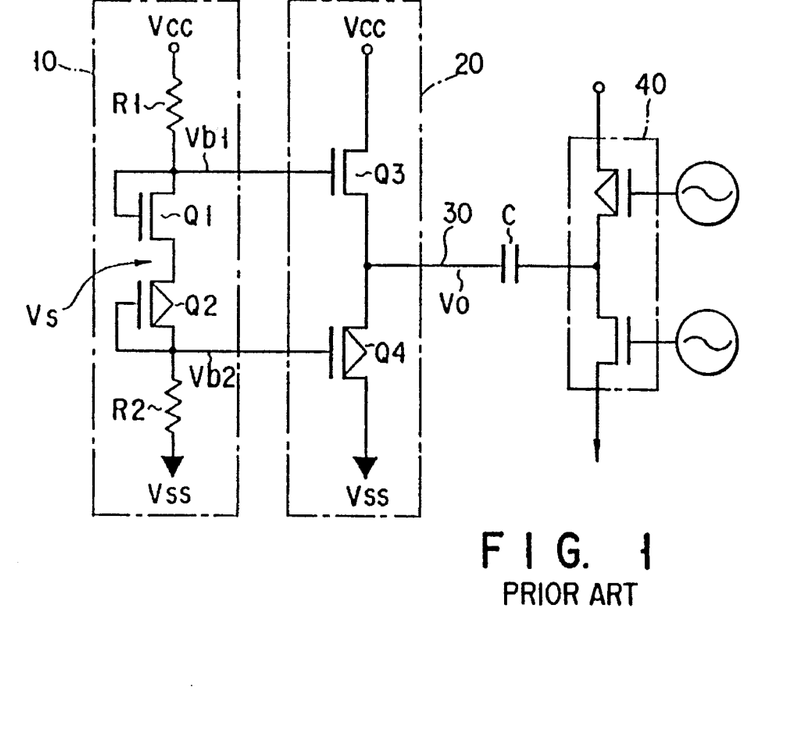
FIG. 1 is a circuit diagram showing a conventional intermediate potential generating circuit.

The conventional intermediate potential generating circuit, as shown in FIG. 1, is constituted by a bias potential generating circuit 10 and a driving circuit 20. In the bias potential generating circuit 10, a resistor R1, a diode-connected n-channel MOS transistor Q1 whose gate and drain are short-circuited, a diode-connected p-channel MOS transistor Q2 whose gate and drain are short-circuited, and a resistor R2 are arranged in series in this order between a voltage supply source Vcc on a high potential side and a voltage supply source Vss on a ground potential side. A reference voltage Vs depending on a resistance ratio of the resistor R1 to the resistor R2 can be obtained at a series-connection point between the MOS transistors Q1 and Q2. A bias voltage Vb1 which is higher than the reference voltage Vs by the threshold voltage of the n-channel MOS transistor Q1 is obtained at a series-connection point between the resistor R1 and the n-channel MOS transistor Q1, and a bias voltage Vb2 which is lower than the reference voltage Vs by the threshold voltage of the p-channel MOS transistor Q2 is obtained at a series-connection point between the resistor R2 and the p-channel MOS transistor Q2. The bias voltages Vb1 and Vb2 are both applied to the driving circuit 20.

The driving circuit 20 is constituted by a source-follower n-channel MOS transistor Q3 and a source-follower p-channel MOS transistor Q4. The n-channel MOS transistor Q3 has a drain connected to the voltage supply source Vcc and a source connected to an output node 30 for obtaining an output potential Vo. The p-channel MOS transistor Q4 has a drain connected to the voltage supply source Vss and a source connected to the output node 30. The bias voltages Vb1 and Vb2 obtained by the bias potential generating circuit 10 are applied to the gates of the MOS transistors Q3 and Q4, respectively.

In FIG. 1, reference symbol C denotes a parasitic capacitor, and reference numeral 40 denotes a load circuit, driven by the driving circuit 20, for forming an inverter circuit obtained by series-connecting a p-channel MOS transistor Q7 and an n-channel MOS transistor Q8.

The intermediate potential generating circuit has a preferable load drivability and low current consumption characteristics in a non-load state. The driving circuit 20 is constituted by the source-follower MOS transistors Q3 and Q4. As a result, when the value of a load current flowing in the load circuit 40 connected to the output node 30 is

2 increased, a variation in the output potential Vo is undesirably increased with respect to the set reference voltage Vs.

when the load drivability of the MOS transistors Q3 and Q4 in the driving circuit 20 is increased to suppress variation in the output voltage Vo caused by the load current flowing in the load circuit 40, a difference between each of the bias voltages Vb1 and Vb2 and the reference potential Vs is essentially higher than each of the threshold voltages of the MOS transistors Q3 and Q4. Therefore, a through current undesirably flows between the voltage supply sources Vcc and Vss in the driving circuit 20 in a non-load state.

Thus, in the conventional intermediate potential generating circuit, as the load current is increased, variation in output potential is undesirably increased. However, even if this drawback were eliminated, current consumption in a non-load state would be increased.

SUMMARY OF THE INVENTION

The present invention has been developed in light of the above circumstances, and has as its object to provide an intermediate potential generating circuit capable of decreasing variation in output potential with respect to a set potential even when a load current is increased and preventing low current consumption characteristics in a non-load state from being degraded.

According to the present invention, an intermediate potential generating circuit comprises a first voltage supply source, an output node for outputting an intermediate potential, a source-follower first MOS transistor of a first conductivity type connected between the first voltage supply source and the output node, and a second MOS transistor of a second conductivity type having a source and a drain inserted between the first voltage supply source and the output node, and a gate controlled by a voltage depending on a current flowing in the first MOS transistor.

In the intermediate potential generating circuit according to the present invention, the gate of the second MOS transistor is controlled by a voltage having a value depending on a current flowing between the source and drain of the source-follower first MOS transistor so as to cause a current to flow from the first voltage supply source to the output node, thereby setting the potential of the output node.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given ·bove and the detailed description of the preferred embodiments given below, serve to explain the principles of the invention.

DETAILED DESCRIPTION OF THE PREFERRED EMBODIMENTS

A first embodiment of an intermediate potential generating circuit having an output stabilizing circuit according to the present invention will be described below, with reference to the accompanying drawings.

Figure 2:
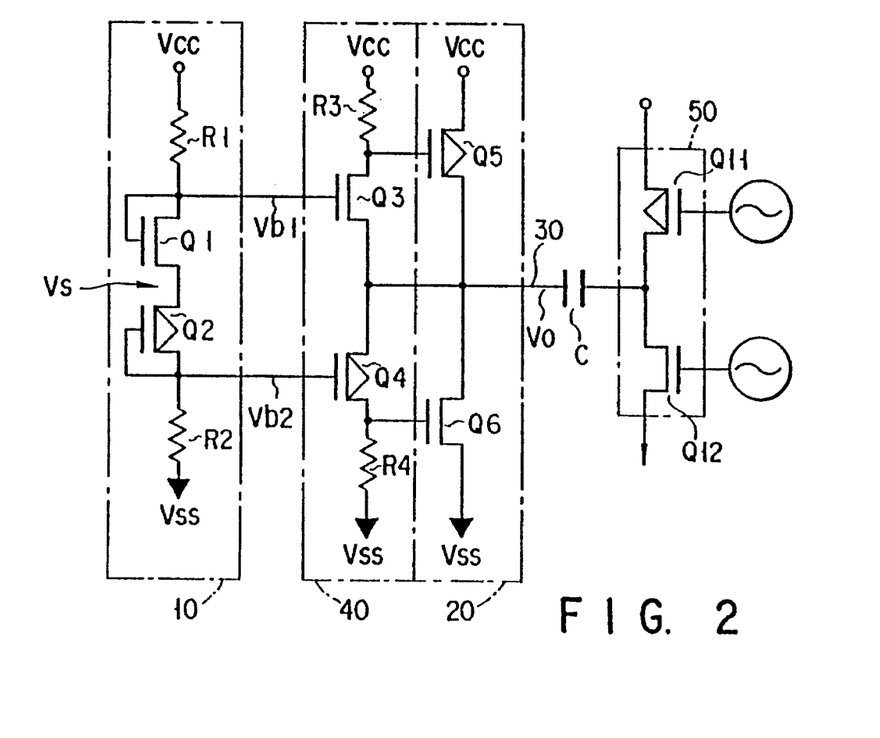
FIG. 2 is a circuit diagram showing a first embodiment of an intermediate potential generating circuit having an output potential stabilizing circuit.

FIG. 2 is a circuit diagram showing an arrangement according to the first embodiment of the present invention. In this embodiment, an intermediate potential generating circuit is constituted by a bias potential generating circuit 10, a driving circuit 20, an output potential stabilizing circuit 40, and a load circuit 50. Note that reference symbol C denotes a parasitic capacitor.

In the bias potential generating circuit 10, a resistor R1, a diode-connected n-channel MOS transistor Q1 whose gate and drain are short-circuited, a diode-connected p-channel MOS transistor Q2 whose gate and drain are short-circuited, and a resistor R2 are arranged in series in this order between a voltage supply source Vcc on a high potential side and a voltage supply source Vss on a ground potential side. A reference voltage Vs depending on a resistance ratio of the resistor R1 to the resistor R2 can be obtained at a series-connection point between the MOS transistors Q1 and Q2. A bias voltage Vb1 which is higher than the reference voltage Vs by the threshold voltage of the n-channel MOS transistor Q1 is obtained at a series-connection point between the resistor R1 and the n-channel MOS transistor Q1. Similarly, a bias voltage Vb2 which is lower than the reference voltage Vs by the threshold voltage of the p-channel MOS transistor Q2 is obtained at a series-connection point between the resistor R2 and the p-channel MOS transistor Q2. The bias voltages Vb1 and Vb2 are applied to an n-channel MOS transistor Q3 and a p-channel MOS transistor Q4 of the output potential stabilizing circuit 40, respectively.

The output potential stabilizing circuit 40 is formed such that a resistor R3, the n-channel MOS transistor Q3, and a p-channel MOS transistor Q4 are connected in series between the voltage supply sources Vcc and Vss.

The source-follower n-channel MOS transistor Q3 has a drain connected to one terminal of the resistor R3, a source connected to an output node 30 for obtaining an output potential Vo, and the gate for receiving the bias potential Vb1. The source-follower p-channel MOS transistor Q4 has a drain connected to the other terminal of the resistor R3, a source connected to the output node 30, and the gate foe receiving the bias voltage Vb2.

The driving circuit 20 is constituted by a p-channel MOS transistor Q5 and an n-channel MOS transistor Q6. The p-channel MOS transistor Q5 has a source connected to the voltage supply source Vcc, a drain connected to an output node 30, and a gate connected to a series-connection point between the resistor R3 and the MOS transistor Q3. The n-channel MOS transistor Q6 has a source connected to the voltage supply source Vss, a drain connected to the output node 30, and a gate connected to a series-connected point between a resistor R4 and the MOS transistor Q4.

The load circuit 50 is formed such that a p-channel MOS transistor Q11 and an n-channel MOS transistor Q12 are connected in series between the voltage supply sources Vcc and Vss.

In the driving circuit 20, the gate of the p-channel MOS transistor Q5 is controlled by a voltage drop which occurs across the resistor R3 in accordance with a current flowing in the source-follower n-channel MOS transistor Q3, and the gate of the n-channel MOS transistor Q6 is controlled by a voltage drop which occurs across the resistor R4 in accordance with a current flowing in the source-follower p-channel MOS transistor Q4, thereby setting the potential Vo of the output node 30.

In the intermediate potential generating circuit having an output stabilizing circuit arranged as described above according to the present invention, an output potential stabilizing operation of the output node 30 is performed as follows.

Assume that the MOS transistor Q11 of the load circuit 50 is turned on, that the MOS transistor Q12 is turned off, and that the output potential Vo of the output node 30 is higher than the sum (Vb2+|VTHQ4|) of the bias potential Vb2 and the absolute value |VTHQ4| of the threshold voltage of the p-channel MOS transistor Q4. At this time, the transistor Q4 is turned on, whereby a current from the parasitic capacitor C flows through it, and a voltage drop occurs across the resistor R4. When the voltage drop across the resistor R4 exceeds the threshold voltage of the n-channel MOS transistor Q6, the MOS transistor Q6 is turned on. In this manner, the output node 30 is drawn by a current flowing from the MOS transistor Q6 to the voltage supply source Vss, thereby decreasing the output potential Vo of the output node 30. In this case, if the gate width of the p-channel MOS transistor Q4 is set to be equal to that of the p-channel MOS transistor Q2 in the bias potential generating circuit 10, the threshold voltages of the MOS transistors Q4 and Q2 are equal to each other. When each of the threshold voltages is represented by |VTHP|, (Vb2+|VTHQ4|) becomes (Vs−|VTHP|+|VTHP|)=Vs.

Assume that the MOS transistor Q11 of the load circuit 50 is turned off, that the MOS transistor Q12 is turned on, and that the output voltage Vo of the output node 30 is lower than a difference (Vb1−VTHQ3) between the bias potential Vb1 and the threshold voltage of the p-channel MOS transistor Q3. At this time, the transistor Q3 is turned on to cause a current to flow from the voltage supply source Vcc to the resistor R3, and a voltage drop occurs across the resistor R3. When the voltage drop exceeds the absolute value of the threshold voltage of the p-channel MOS transistor Q5, the MOS transistor Q5 is turned on, and a sufficiently large current flows from the voltage supply source Vcc to the output node 30. In this manner, the output potential Vo of the output node 30 is increased. In this case, if the gate width of the n-channel MOS transistor Q3 is set to be equal to that of the n-channel MOS transistor Q1 in the bias potential generating circuit 10, the threshold voltages of the MOS transistors Q3 and Q1 are equal to each other. When each of the threshold voltages is represented by VTHN, (Vb1+VTHQ3) becomes (Vs+VTHN−VTHN)=Vs.

In the circuit according to this embodiment, when a load current is increased, and the potential Vo of the output node 30 is higher than the reference voltage Vs set by the bias potential generating circuit 10, the driving circuit 20 operates to decrease the potential Vo. On the other hand, when the potential Vo is lower than the reference voltage Vs, the driving circuit 20 is operated to increase the potential Vo. In this manner, the output potential Vo is controlled to be kept constant.

In addition, a load current is increased, and the charging/discharging operation of the parasitic capacitor C is abruptly performed by the resistors R3 and R4.

The improvement of a variation in output potential in an increase in load current in the circuit of this embodiment will be described below, being compared with a conventional circuit.

Figure 3:
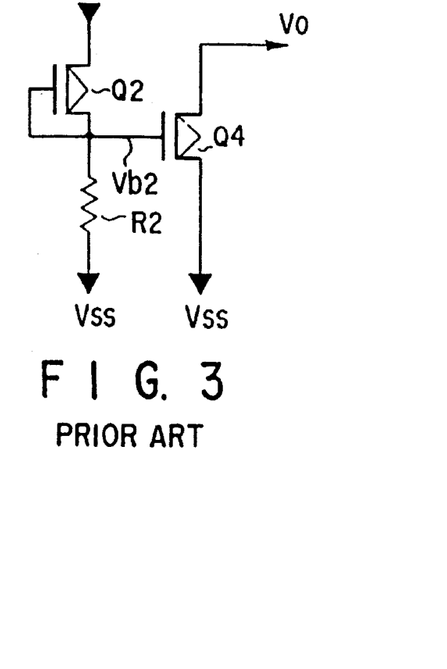
FIG. 3 is a circuit diagram showing a part of the conventional intermediate potential generating circuit for explaining the circuit diagram shown in FIG. 1.

FIG. 3 is a circuit diagram showing the lower halves of the bias potential generating circuit 10 and the driving circuit 20 in the conventional circuit in FIG. 1, i.e. a part constituted by p-channel MOS transistors.

In the case of the circuit shown in FIG. 3, when the output potential Vo is higher than the sum (Vb2+|VTHQ4|) of the absolute value |VTHQ4| of the threshold voltage of the p-channel MOS transistor Q4 and the bias potential Vb2 at the series-connection point between the MOS transistor Q2 and the resistor R2 to turn on the transistor Q4, a current I flowing in the MOS transistor Q4 is given by ΔV=Vo−Vs and the current amplification factor of the MOS transistor Q4. That is, when a β value is represented by βQ4, the current I is given by equation (1):

$$I = \tfrac{1}{2} \beta Q4 \Delta V^2 \qquad (1)$$

where $\beta = \beta_0 W/L$

In the conventional circuit, it is found that ΔV is proportional to a power of ½ to the load current I.

Figure 4:
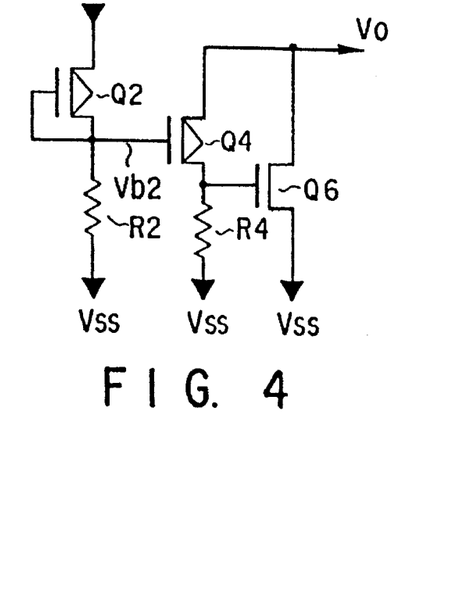
FIG. 4 is a circuit diagram showing a part of the intermediate potential generating circuit shown in FIG. 2 used for explaining the intermediate potential generating circuit.

FIG. 4 is a circuit diagram showing, as in FIG. 3, the arrangement of the lower halves of the bias potential generating circuit 10, the output potential stabilizing circuit 40, and the driving circuit 20 in the circuit of the embodiment shown in FIG. 2.

In the case of the circuit shown in FIG. 4, when the output potential Vo is higher than the sum (Vb2+|VTHQ4|) of the bias potential Vb2 and the absolute value |VTHQ4| of the threshold voltage of the p-channel MOS transistor Q4 to turn on the transistor Q4, and the voltage drop across the resistor R4 exceeds a threshold voltage VTHQ6 of the n-channel MOS transistor Q6, a current I flowing in the MOS transistor Q6 is given by ΔV=Vo−Vs and the current amplification factors of the MOS transistors Q4 and Q6. That is, when βvalues are represented by βQ4 and βQ6, the current I is given by equation (2):

$$I = \tfrac{1}{2} \beta Q6 (\tfrac{1}{2} R4 \beta Q1 \Delta V^2 - VTHQ6)^2 \qquad (2)$$

In the circuit according to the first embodiment shown in FIG. 2, it is found that ΔV is proportional to a power of ¼ to the current I.

The same applies to the upper-half circuits of the bias potential generating circuit 10, the output potential stabilizing circuit 40, and the driving circuit 20 of each of the conventional circuit and the circuit according to the first embodiment.

As described above, in the conventional circuit, a variation (ΔV) in output potential Vo from the reference voltage Vs caused by an increase in the load current I is proportional to a power of ½ of the load current I. In the circuit according to this embodiment, the variation (ΔV) is proportional to a power of ¼ of the load current I. In other words, the variation in output potential caused by an increase in load current is smaller in the circuit of this embodiment than in the conventional circuit.

A variation in the output potential Vo in actually increasing the value of the load current was measured in each of the conventional circuit and the circuit according to the first embodiment. The results are shown in the graph of FIG. 5.

Figure 5:
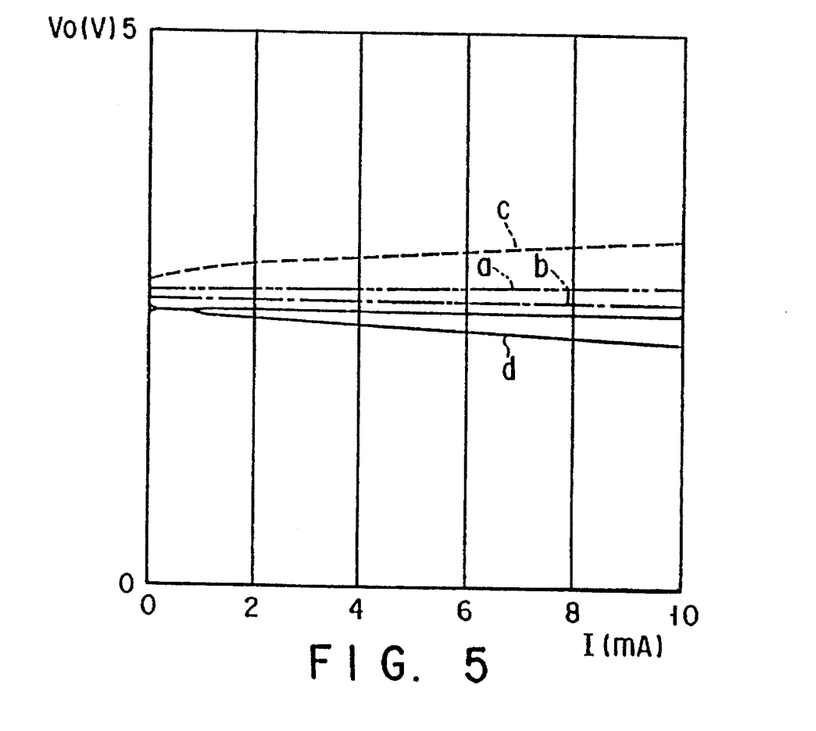
FIG. 5 is a graph of output potential variations in the conventional circuit diagram and that of the first embodiment when load currents are varied.

In FIG. 5, the value of the voltage supply source Vcc is set to be 5V, and the value of the reference voltage Vs in the bias potential generating circuit 10 is set to be about 2.6 V. In FIG. 5, reference symbols a and b indicate variations in output potential in the circuit according to the first embodiment, and reference symbols c and d indicate variations in output potential in the conventional circuit. The reference symbols a and b indicate variations in output potential when the value of the load current is increased such that the load current flows into the output node, and the reference symbols c and d indicate variations in output potential when the value of the load current is increased such that the load current flows from the output node. As is apparent from FIG. 5, the variation in output potential Vo caused by an increase in load current is smaller in the circuit according to the first embodiment than in the conventional circuit.

Figure 6:
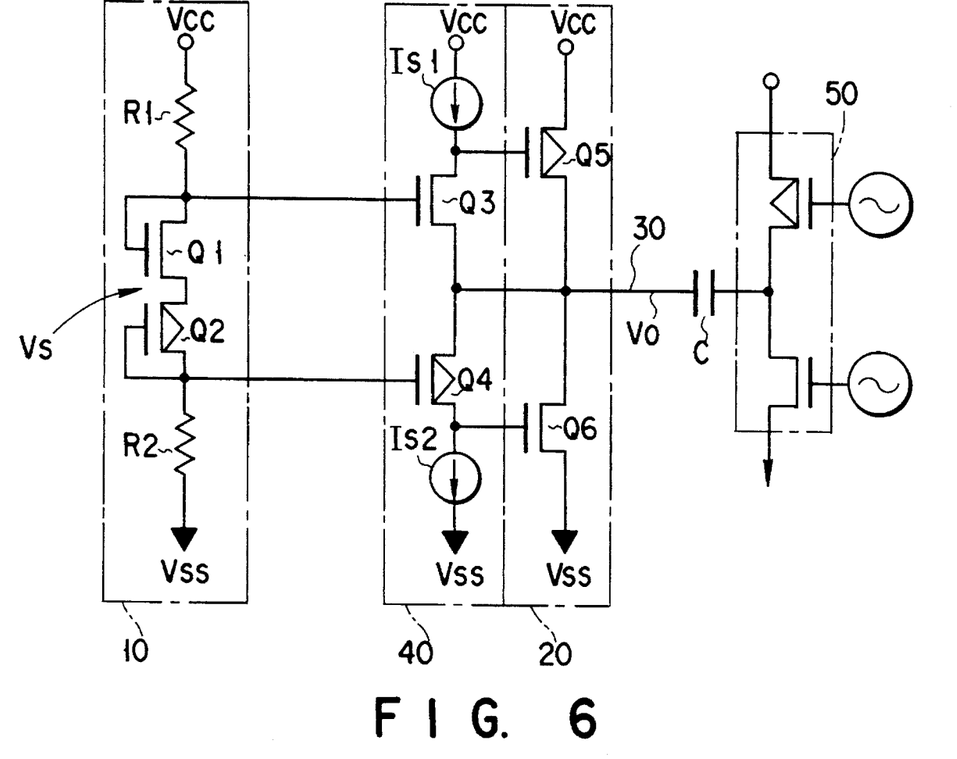
FIG. 6 is a circuit diagram showing a second embodiment of an intermediate potential generating circuit having an output potential stabilizing circuit.

FIG. 6 is a circuit diagram showing an arrangement according to a second embodiment of the present invention.

An intermediate potential generating circuit having an output stabilizing circuit according to the second embodiment differs from the circuit according to the first embodiment shown in FIG. 2 in that constant current sources Is1 and Is2 are used in the output stabilizing circuit 40 in place of the two resistors R3 and R4.

Figure 7:
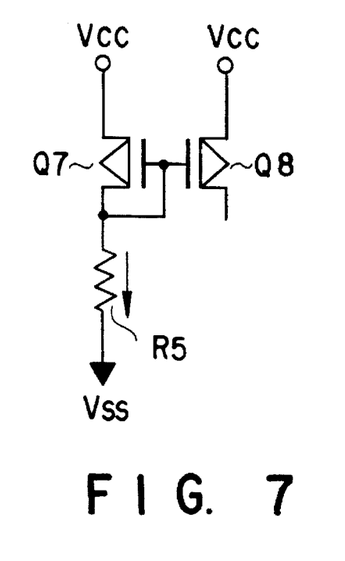
FIG. 7 is a circuit diagram showing one constant current source shown in FIG. 6 in detail.
Figure 8:
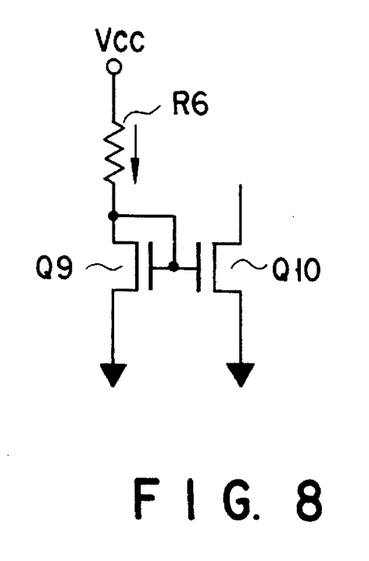
FIG. 8 is a circuit diagram showing another constant current source shown in FIG. 6 in detail.

The constant current source Is1, as shown in FIG. 7, is constituted by two p-channel MOS transistors Q7 and Q8 which are connected to each other to constitute a current mirror circuit and a resistor R5 for setting a current value. A current flowing in the MOS transistor Q8 is supplied to a MOS transistor Q3. The constant current source Is2, as shown in FIG. 8, is constituted by two n-channel transistors Q9 and Q10 which are connected to each other to constitute a current mirror circuit and a resistor R6 for setting a current value. A current from a MOS transistor Q4 is supplied to the MOS transistor Q10.

In the circuit according to each of the first and second embodiments, shown in FIGS. 2 and 6, the drivability of the driving circuit 20 is determined by the current amplification factors of the p-channel MOS transistor Q5 and the n-channel MOS transistor Q6, i.e., β values, For this reason, the current amplification factors of the MOS transistors Q3 and Q4, i.e., the β values do not have to be increased. The threshold voltages of the MOS transistors Q1 and Q2 in bias potential generating circuit 10 are set to be equal to each other, as are the threshold voltages of the MOS transistors Q3 and Q4 in output potential stabilizing circuit 40, thereby preventing a dead band from being formed in the output characteristics. Since the threshold voltages of the MOS transistors Q1 and Q2 and of the MOS transistors Q3 and Q4 can be set to be equal to each other, therefore, unlike the conventional circuit, the low current consumption characteristics in a non-load state are not degraded.

In the circuits according to the first and second embodiments, the threshold values of the MOS transistors Q1 and Q3 or of the MOS transistors Q2 and Q4 can be made to differ from each other by changing their gate widths or lengths. In such a case, when an output potential Vo has a value close to a reference voltage Vs, the driving circuit 20 can prevent a through current from being generated between the voltage supply source Vcc and the voltage supply source Vss.

When the threshold values of the MOS transistors Q1 and Q3 and of the MOS transistors Q2 and Q4 are set to be equal to each other, the MOS transistors Q3 and Q4 are simultaneously turned on until Vo=Vs is satisfied. In such a case, the MOS transistors Q5 and Q6 are simultaneously turned on, and a current is drawn simultaneously by the MOS transistors Q5 and Q6. In this state, however, even when Vo=Vs, the MOS transistors Q5 and Q6 are simultaneously turned on, and a through current is generated between the voltage supply source Vcc and the voltage supply source Vss. In order to prevent a through current from being generated, the gate width of the MOS transistor Q4 can, for example, be set to be smaller than that of the MOS transistor Q2, or the gate length of the MOS transistor Q4 is set to be larger than that of the MOS transistor Q2, so that the absolute value |VTHP4| of the threshold voltage of the MOS transistor Q4 is set to be larger than the absolute value |VTHP2| of the threshold voltage of the MOS transistor Q2. The reason for a through current being prevented from flowing under the condition |VTHP4|>|VTHP2| will be explained below.

when Vo<Vs, until $$Vo-Vb1=VTHQ3=VTHQ1=Vs-Vb1 \quad (3)$$

is satisfied, the MOS transistor Q3 is turned on. However, when Vo>Vs, the MOS transistor Q3 is turned off.

When |VTHP4|=|VTHP2|, the MOS transistor Q4 is turned on. For this reason, the following equation is obtained:

$$Vo-Vb2=VTHP4=|VTHP2|=Vs-Vb2 \quad (4)$$

when |VTHP4|>|VTHP2|, until Vo is increased to satisfy $$Vo-Vb2=|VTHP4|(>VTHP2|=Vs-Vb2) \quad (5)$$

the MOS transistor Q4 is not turned on.

In other words, when Vo−Vs=|VTHP4|−|VTHP2|, the MOS transistors Q3 and Q4 are not turned on. For this reason, no through current is generated. In a period during which the MOS transistors Q3 and Q4 are both set in an OFF state, the output characteristics have a dead band. By changing the gate widths or gate lengths of the MOS transistors Q3 and Q1, the threshold voltage of the MOS transistor Q3 may be set to be higher the threshold voltage of the MOS transistor Q1.

Figure 9:
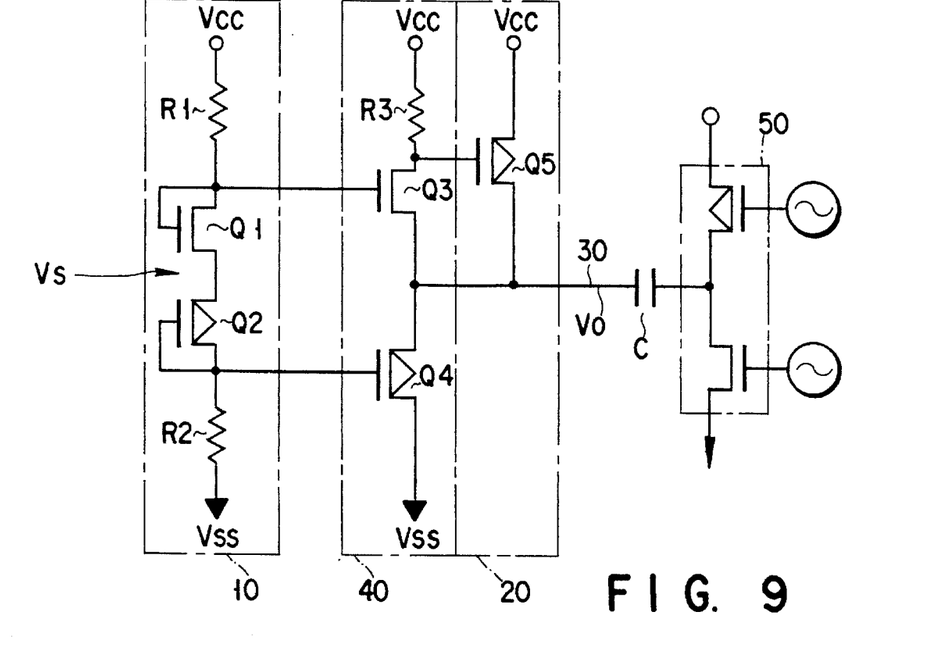
FIG. 9 is a circuit diagram showing a third embodiment of an intermediate potential generating circuit having an output potential stabilizing circuit.

FIG. 9 is a circuit diagram showing the arrangement of an intermediate potential generating circuit having an output stabilizing circuit according to a third embodiment of the present invention.

The intermediate potential generating circuit in the embodiment shown in FIG. 9 is obtained by the resistor B4 and the n-channel MOS transistor Q6 being removed from the circuit of the embodiment shown in FIG. 2. In a driving circuit 20, an arrangement for charging an output node 30 using a voltage supply source Vcc is the same as that shown in FIG. 2, and an arrangement for discharging the output node 30 to a voltage supply source Vss is the same as that of the conventional circuit shown in FIG. 1.

Figure 10:
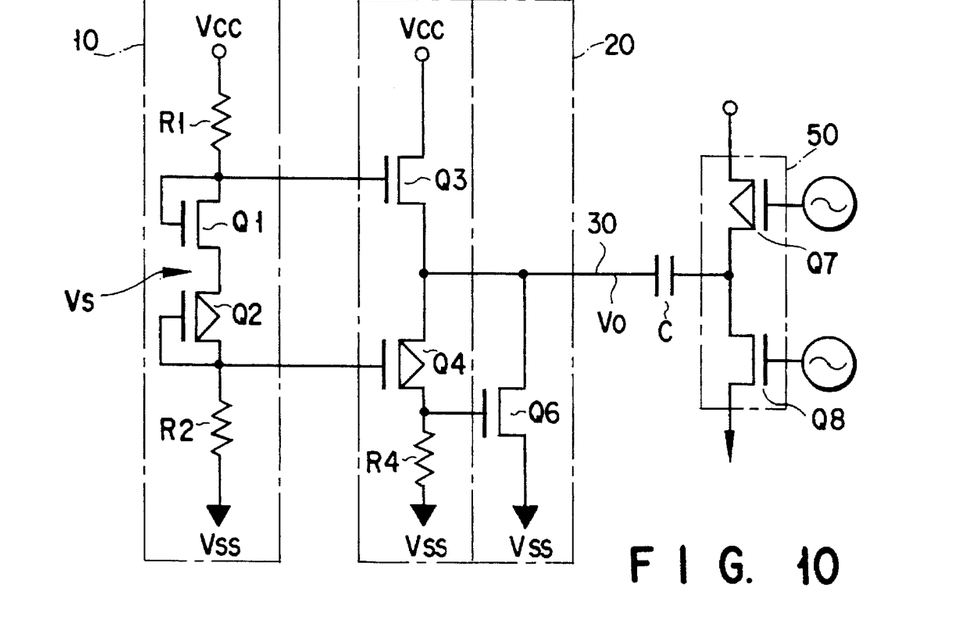
FIG. 10 is a circuit diagram showing a fourth embodiment of an intermediate potential generating circuit having an output potential stabilizing circuit.

FIG. 10 is a circuit diagram showing the arrangement of an intermediate potential generating circuit having an output stabilizing circuit according to a fourth embodiment of the present invention.

The intermediate potential generating circuit shown in FIG. 10 is obtained by the resistor R3 and the p-channel MOS transistor Q5 being removed from the circuit of the embodiment shown in FIG. 2. In the circuit of the fourth embodiment, in contrast to the circuit according to the embodiment in FIG. 9, an arrangement for charging an output node 30 using a voltage supply source Vcc in a driving circuit 20 is the same as that of the conventional circuit shown in FIG. 1, and an arrangement for discharging the output node 30 to the voltage supply source Vss is the same as that of the circuit of the embodiment shown in FIG. 2.

As has been described above, according to the present invention, an intermediate potential generating circuit is provided which is capable of decreasing a variation in output potential with respect to a set potential even when a load current is increased and can prevent low current consumption characteristics in a non-load state from being degraded.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An intermediate potential generating circuit, comprising:

an output node;

a bias potential generating circuit for generating a first potential and a second potential;

a first output potential stabilizing circuit comprising a first load having a first terminal connected to a first power source, and a first field effect transistor having a first threshold voltage, a first current terminal connected to a second terminal of said first load and a second current terminal connected to said output node, and a gate connected to said bias potential generating circuit for receiving said first potential, said first output potential stabilizing circuit generating a first control potential ($V_{11}$) which is output from a node between said first current terminal of said first field effect transistor and said second terminal of said first load, a variation $\Delta V_{11}$ of which is expressed by a following equation (1):

$$\Delta V_{11} = \alpha_{11} \Delta Vo^2 \quad (1)$$

where $\Delta Vo$ is a variation of an output potential at said output node, and $\alpha_{11}$ is a first coefficient, a second output potential stabilizing circuit comprising a second load having a first terminal connected to a second power source, and a second field effect transistor having a second threshold voltage, a first current terminal connected to said output node and a second current terminal connected to a second terminal of said second load, and a gate of said second transistor being connected to said bias potential generating circuit for receiving said second potential, said second output potential stabilizing circuit generating a second control potential ($V_{12}$) which is output from a node between said second current terminal of said second field effect transistor and said first terminal of said second load, a variation $\Delta V_{12}$ of which is expressed by a following equation (2):

$$\Delta V_{12} = \alpha_{12} \Delta V_o^2 \tag{2}$$

where $\alpha_{12}$ is a second coefficient, a first driving circuit connected to said first output potential stabilizing circuit for receiving said first control potential and supplying a first output current ($I_{11}$) to said output node, a variation $\Delta I_{11}$ of which is expressed by a following equation (3):

$$\Delta I_{11} = \beta_{11} \Delta V_{11}^2 \tag{3}$$

where $\beta_{11}$ is a third coefficient, so that said output current $\Delta I_{11}$ is expressed by a following equation (4):

$$\Delta I_{11} = \alpha_{11} \beta_{11} \Delta V_o^2 \tag{4}$$

a second driving circuit connected to said second output potential stabilizing circuit for receiving said second control potential and supplying a second output current ($I_{12}$) to said output node, a variation $\Delta I_{12}$ of which is expressed by a following equation (5):

$$\Delta I_{12} = \beta_{12} \Delta V_{12}^2 \tag{5}$$

where $\beta_{12}$ is a fourth coefficient, so that said output current $\Delta I_{12}$ is expressed by a following equation (6):

$$\Delta I_{12} = \alpha_{12} \beta_{12} \Delta V_o^4 \tag{6}$$

2. The circuit according to claim 1, wherein said first driving circuit is arranged between said first power source and said output node and said second driving circuit is arranged between said second power source and said output node.

3. The circuit according to claim 2, wherein said first load and said first field effect transistor in said first output potential stabilizing circuit are a first resistance element and a first N-channel field effect transistor respectively, and said second load and said second field effect transistor in said second output potential stabilizing circuit are a second resistance element and a first P-channel field effect transistor respectively.

4. The circuit according to claim 1, wherein said bias potential generating circuit includes a series circuit composed of a third resistance element, a second N-channel field effect transistor, a second P-channel field effect transistor, and a fourth resistance element, wherein the gate of said second N-channel field effect transistor and a first current terminal thereof are connected with each other, and the gate of said second P-channel field effect transistor and a first current terminal thereof are connected with each other.

5. The circuit according to claim 3, wherein a first terminal of said first resistance element is connected to said first power source, a second terminal of said first resistance element is connected to a first current terminal of said first N-channel field effect transistor, a second current terminal of said first N-channel field effect transistor is connected to a first current terminal of said first P-channel field effect transistor, a second current terminal of said first P-channel field effect transistor is connected to a first terminal of said second resistance element, and a second terminal of said second resistance element is connected to said second power source.

6. The circuit according to claim 4, wherein a first terminal of said third resistance element is connected to said first power source, a second terminal of said third resistance element is connected to the first current terminal of said second N-channel field effect transistor, a second current terminal of said second N-channel field effect transistor is connected to a second current terminal of said second P-channel field effect transistor, a first current terminal of said second P-channel field effect transistor is connected to a first terminal of said fourth resistance element, and a second terminal of said fourth resistance element is connected to said second power source.

7. An intermediate potential generating circuit, comprising:

an output node;

a bias potential generating circuit for generating a potential;

an output potential stabilizing circuit comprising a first load having a first terminal connected to a first power source, and a first field effect transistor having a first threshold voltage, a first current terminal connected to a second terminal of said first load and a second current terminal connected to said output node and a gate connected to said bias potential generating circuit for receiving said potential, said output potential stabilizing circuit generating a control potential (V) which is output from a node between said first current terminal of said first field effect transistor and said second terminal of said first load, a variation $\Delta V$ of which is expressed by a following equation (1):

$$\Delta V = \alpha \Delta V_o^2 \tag{1}$$

where $\Delta Vo$ is a variation of an output potential at said output node, and $\alpha$ is a first coefficient, a driving circuit connected to said output potential stabilizing circuit for receiving said control potential supplying an output current (I) to said output node, a variation $\Delta I$ of which is expressed by a following equation (2):

$$\Delta I = \beta \Delta V^2 \tag{2}$$

where $\beta$ is a second coefficient, so that said output current $\Delta I$ is expressed by a following equation (3):

$$\Delta = \alpha \beta \Delta Vo^4 \tag{3}$$

8. The circuit according to claim 7, wherein said driving circuit is arranged between said first power source and said output node.

9. The circuit according to claim 8, wherein said first load and said first field effect transistor in said output potential stabilizing circuit are a first resistance element and a first N-channel field effect transistor respectively.

10. The circuit according to claim 8, wherein said driving circuit includes a first P-channel field effect transistor.

11. The circuit according to claim 7, wherein said driving circuit is arranged between a second power source and said output node.

12. The circuit according to claim 11, wherein said output potential stabilizing circuit includes a second load and a second field effect transistor, said second load and said second field effect transistor being a second resistance element and a second P-channel field effect transistor respectively.

13. The circuit according to claim 11, wherein said driving circuit includes a second N-channel field effect transistor.

14. The circuit according to claim 7, wherein said bias potential generating circuit includes a series circuit composed of a third resistance element, a second N-channel field effect transistor, a second P-channel field effect transistor and a fourth resistance element, such that the gate of said second N-channel field effect transistor and a first current path thereof are connected with each other, and the gate of said second P-channel field effect transistor and a first current path thereof are connected with each other.

15. The circuit according to claim 9, wherein a first terminal of said first resistance element is connected to said first power source, a second terminal of said first resistance element is connected to a first current terminal of said first N-channel field effect transistor, and a second current terminal of said first N-channel field effect transistor is connected to said output node.

16. The circuit according to claim 12, wherein a first terminal of said second resistance element is connected to said second power source, a second terminal of said second resistance element is connected to a first current terminal of said first P-channel field effect transistor, and a second current terminal of said first N-channel field effect transistor is connected to said output node.

17. The circuit according to claim 14, wherein a first terminal of said third resistance element is connected to said first power source, a second terminal of said resistance element is connected to said first current terminal of said second N-channel field effect transistor, a second current terminal of said second N-channel field effect transistor is connected to a second current terminal of said second P-channel field effect transistor, a first current terminal of said second P-channel field effect transistor is connected to a first terminal of said fourth resistance element, and a second terminal of said fourth resistance element is connected to said second power source.

* * * * *